United States Patent
Saito et al.

(10) Patent No.: US 9,508,710 B2
(45) Date of Patent: Nov. 29, 2016

(54) SEMICONDUCTOR DEVICE

(71) Applicants: Jun Saito, Nagoya (JP); Satoru Machida, Nagakute (JP); Yusuke Yamashita, Nagoya (JP)

(72) Inventors: Jun Saito, Nagoya (JP); Satoru Machida, Nagakute (JP); Yusuke Yamashita, Nagoya (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 14/901,579

(22) PCT Filed: Aug. 26, 2013

(86) PCT No.: PCT/JP2013/072751
§ 371 (c)(1),
(2) Date: Dec. 28, 2015

(87) PCT Pub. No.: WO2015/029116
PCT Pub. Date: Mar. 5, 2015

(65) Prior Publication Data
US 2016/0268252 A1    Sep. 15, 2016

(51) Int. Cl.
*H01L 29/66* (2006.01)
*H01L 27/06* (2006.01)
*H01L 29/872* (2006.01)
*H01L 29/739* (2006.01)
*H01L 29/10* (2006.01)

(52) U.S. Cl.
CPC ....... *H01L 27/0629* (2013.01); *H01L 29/1095* (2013.01); *H01L 29/7397* (2013.01); *H01L 29/872* (2013.01)

(58) Field of Classification Search
CPC .................................................... H01L 29/872
USPC .......................................................... 257/140
See application file for complete search history.

(56) References Cited

U.S. PATENT DOCUMENTS

| | | | |
|---|---|---|---|
| 6,774,434 B2 | 8/2004 | Hueting et al. | |
| 9,159,721 B2 * | 10/2015 | Okawara | H01L 27/0635 |
| 2012/0043581 A1 | 2/2012 | Koyama et al. | |
| 2014/0048847 A1 | 2/2014 | Yamashita et al. | |

FOREIGN PATENT DOCUMENTS

| | | | | |
|---|---|---|---|---|
| JP | 2005-510059 A | 4/2005 | | |
| JP | 2012-043890 A | 3/2012 | | |
| JP | 2012-049562 A | 3/2012 | | |
| JP | 2013-048230 A | 3/2013 | | |
| JP | 2013051345 A | 3/2013 | | |
| JP | 2013051346 A | 3/2013 | | |
| WO | WO 2013014943 A2 * | 1/2013 | ........... | H01L 29/407 |

OTHER PUBLICATIONS

Jul. 5, 2016 Notice of Allowance issued in Japanese Application No. 2015-533804.

* cited by examiner

*Primary Examiner* — Matthew Landau
*Assistant Examiner* — Igwe U Anya
(74) *Attorney, Agent, or Firm* — Oliff PLC

(57) ABSTRACT

A technology capable of suppressing a fluctuation in voltage in a diode region is provided. A resistance value between the emitter electrode and the lower body region is lower than a resistance value between the anode electrode and the lower anode region when the semiconductor device operates as a diode. A quantity of holes between the emitter electrode and the second barrier region is smaller than a quantity of holes between the anode electrode and the first barrier region.

4 Claims, 4 Drawing Sheets

SEMICONDUCTOR DEVICE

TECHNICAL FIELD

The present invention relates to a semiconductor device comprising a diode region and an IGBT region in a same semiconductor substrate.

BACKGROUND ART

Japanese Patent Application Publication, No. 2012-043890 A discloses an example of a semiconductor device comprising a diode region and an IGBT region in a same semiconductor substrate.

SUMMARY OF INVENTION

Technical Problem

In a semiconductor device including a diode region and an IGBT region in a same semiconductor substrate, a parasitic diode composed of a body region of the IGBT region, a drift region, and a cathode region of the diode region may be turned on when the semiconductor device operates as a diode. When the parasitic diode is turned on, holes are also injected into the drift region from the body region of the IGBT region, and a conductivity modulation phenomenon causes a reduction in a forward voltage of the diode region. A quantity of holes that are injected from the body region into the drift region varies depending on whether an on-potential is applied to a gate electrode of the IGBT region. That is, when the on-potential is applied to the gate electrode, the quantity of holes that are injected into the drift region is small, and when no on-potential is applied to the gate electrode, the quantity of holes that are injected into the drift region is large. Since the forward voltage of the diode region is determined by the quantity of holes that are injected into the drift region, a fluctuation in the quantity of holes that are injected from the body region of the IGBT region into the drift region leads to a fluctuation in the forward voltage of the diode region. In the conventional semiconductor device, when the parasitic diode is turned on, the quantity of holes that are injected from the body region of the IGBT region into the drift region has had a comparatively larger proportion than a quantity of holes that are injected from an anode region of the diode region into the drift region. This has resulted in such a problem that the forward voltage of the diode region fluctuates greatly depending on presence or absence of the on-potential being applied to the gate electrode.

In order to solve this problem, the present disclosure has an object to provide a technology capable of suppressing such a fluctuation in the forward voltage of the diode region.

Solution to Technical Problem

A semiconductor device disclosed in this disclosure comprises a diode region and an IGBT region in a same semiconductor substrate. The diode region comprises: a cathode electrode; a cathode region configured of a first conductive type semiconductor; a first drift region configured of a first conductive type semiconductor having a low impurity concentration; a lower anode region configured of a second conductive type semiconductor; an upper anode region configured of a second conductive type semiconductor; an anode electrode configured of metal; a first barrier region configured of a first conductive type semiconductor having a higher impurity concentration than the impurity concentration of the first drift region, and arranged between the lower anode region and the upper anode region; and a first pillar region configured of a first conductive type semiconductor having a higher impurity concentration than the impurity concentration of the first barrier region, and arranged so as to connect the first barrier region and the anode electrode. The first pillar region and the anode electrode make a Schottky junction. The IGBT region comprises: a collector electrode; a collector region configured of a second conductive type semiconductor; a second drift region configured of a first conductive type semiconductor having a low impurity concentration, and being in continuation with the first drift region; a lower body region configured of a second conductive type semiconductor; an upper body region configured of a second conductive type semiconductor; an emitter region configured of a first conductive type semiconductor; an emitter electrode configured of metal; a gate electrode opposed to the lower body region and the upper body region that are between the emitter region and the second drift region, with an insulation film interposed therebetween; a second barrier region configured of a first conductive type semiconductor having a higher impurity concentration than the impurity concentration of the second drift region, and arranged between the lower body region and the upper body region; and a second pillar region configured of a first conductive type semiconductor having a higher impurity concentration than the impurity concentration of the second barrier region. The second pillar region and the emitter electrode make a Schottky junction. A resistance value of the second pillar region between the emitter electrode and the second barrier region is lower than a resistance value of the first pillar region between the anode electrode and the first barrier region when the semiconductor device operates as a diode.

The resistance value of the second pillar region between the emitter electrode and the second barrier region is a value including a resistance value at the Schottky junction between the emitter electrode and the second pillar region and a resistance value of the second pillar region on a path from the emitter electrode to the second barrier region. Further, the resistance value of the first pillar region between the anode electrode and the first barrier region is a value including a resistance value at the Schottky junction between the anode electrode and the first pillar region and a resistance value of the first pillar region on a path from the anode electrode to the first barrier region.

Such a configuration makes it possible to suppress a quantity of holes that flow from the upper body region of the IGBT region toward the cathode region of the diode region when the semiconductor device operates as a diode. That is, in the semiconductor device described above, the second pillar region, which makes a Schottky junction with the emitter electrode, is connected to the second barrier region, and the first pillar region, which makes a Schottky junction with the anode region, is connected to the first barrier region. Moreover, the resistance value of the second pillar region between the emitter electrode and the second barrier region is lower than the resistance value of the first pillar region between the anode electrode and the first barrier region when the semiconductor device operates as a diode (i.e. when the forward voltage is applied to the Schottky junction). For this reason, a quantity of holes that are injected from the upper body region into the drift region via the second barrier region is smaller than a quantity of holes that are injected from the upper anode region into the drift region via the first barrier region. Therefore, a quantity of holes that are injected from the body region of the IGBT region into the drift region becomes small relative to a total quantity of holes that are injected into the drift region. As a result, a change in the forward voltage of the diode region due to the presence or absence of an on-potential being applied to the gate electrode of the IGBT region can be suppressed when the semiconductor device operates as a diode.

In the above semiconductor device, an area of a junction surface between the second pillar region and the emitter electrode may be larger than an area of a junction surface between the first pillar region and the anode electrode.

The impurity concentration of the second pillar region may be higher than the impurity concentration of the first pillar region.

When no voltage is applied between the cathode electrode and the anode electrode and between the collector electrode and the emitter electrode, a quantity of holes between the emitter electrode and the second barrier region may be smaller than a quantity of holes between the anode electrode and the first barrier region. Another semiconductor device disclosed in this disclosure comprises a diode region and an IGBT region in a same semiconductor substrate. The diode region comprises: a cathode electrode; a cathode region configured of a first conductive type semiconductor; a first drift region configured of a first conductive type semiconductor having a low impurity concentration; a lower anode region configured of a second conductive type semiconductor; an upper anode region configured of a second conductive type semiconductor; an anode electrode configured of metal; a first barrier region configured of a first conductive type semiconductor having a higher impurity concentration than the impurity concentration of the first drift region, and arranged between the lower anode region and the upper anode region; and a first pillar region configured of a first conductive type semiconductor having a higher impurity concentration than the impurity concentration of the first barrier region, and arranged so as to connect the first barrier region and the anode electrode. The first pillar region and the anode electrode make a Schottky junction. The IGBT region comprises: a collector electrode; a collector region configured of a second conductive type semiconductor; a second drift region configured of a first conductive type semiconductor having a low impurity concentration, and being in continuation with the first drift region; a lower body region configured of a second conductive type semiconductor; an upper body region configured of a second conductive type semiconductor; an emitter region configured of a first conductive type semiconductor; an emitter electrode configured of metal; a gate electrode opposed to the lower body region and the upper body region that are between the emitter region and the second drift region, with an insulation film interposed therebetween; a second barrier region configured of a first conductive type semiconductor having a higher impurity concentration than the impurity concentration of the second drift region, and arranged between the lower body region and the upper body region; and a second pillar region configured of a first conductive type semiconductor having a higher impurity concentration than the impurity concentration of the second barrier region. The second pillar region and the emitter electrode make a Schottky junction. When no voltage is applied between the cathode electrode and the anode electrode and between the collector electrode and the emitter electrode, a quantity of holes between the emitter electrode and the second barrier region may be smaller than a quantity of holes between the anode electrode and the first barrier region.

DESCRIPTION OF EMBODIMENTS

Embodiment 1

Figure 1:
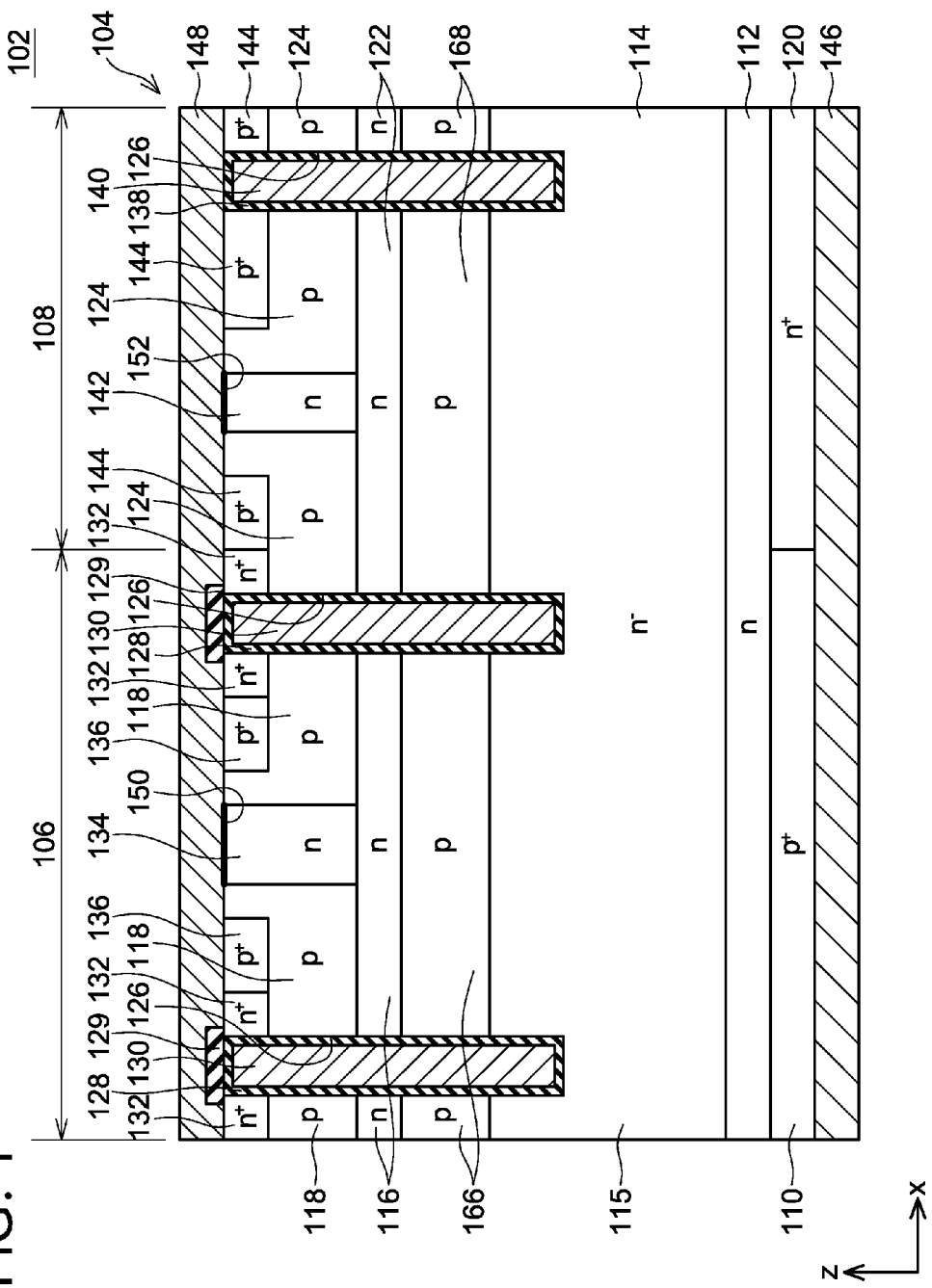
FIG. 1 is a cross-sectional view schematically showing a configuration of a semiconductor device.
Figure 2:
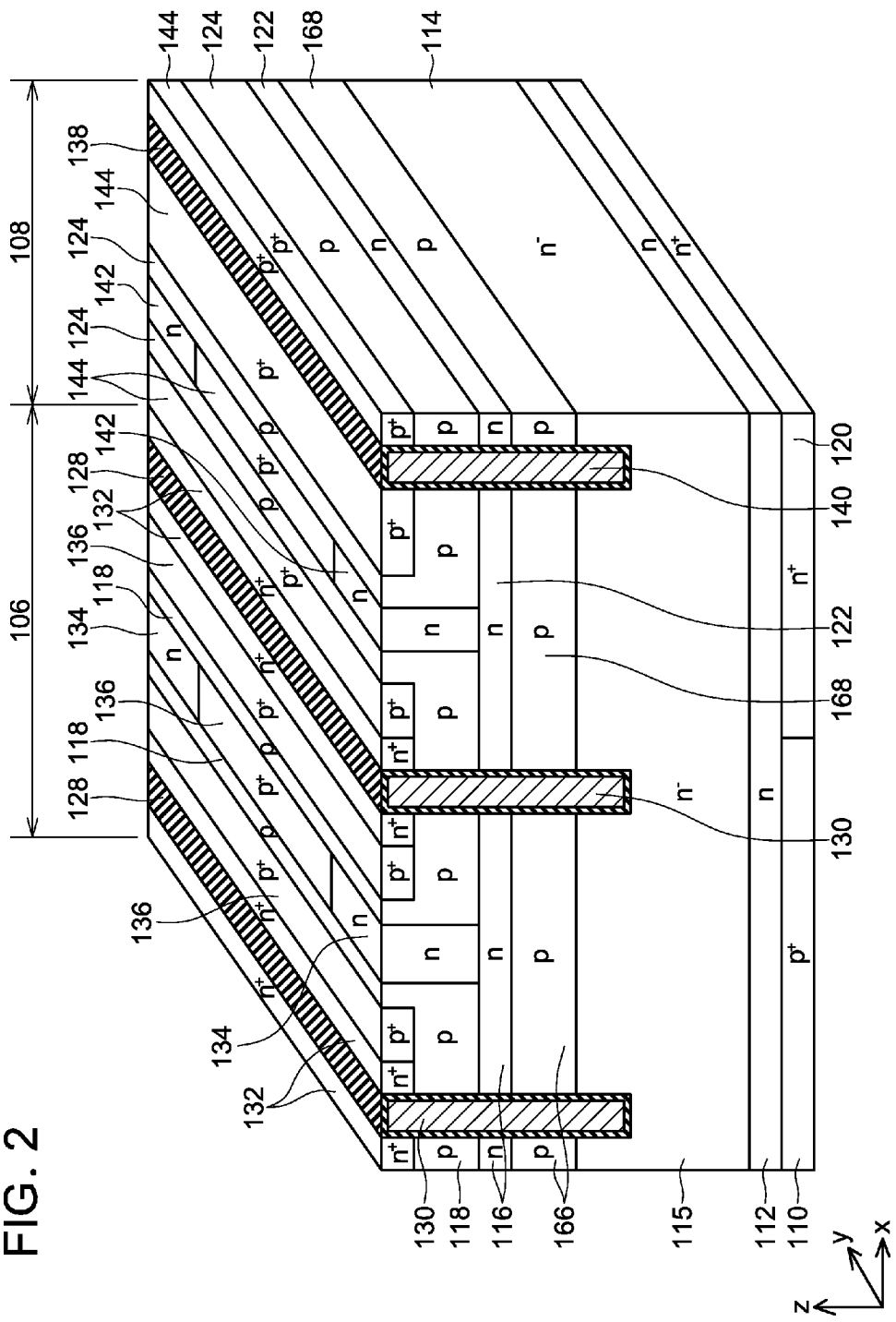
FIG. 2 is a perspective view schematically showing the configuration of the semiconductor device.

As shown in FIGS. 1 and 2, a semiconductor device 102 according to Embodiment 1 is provided using a semiconductor substrate 104 configured of silicon. The semiconductor device 102 comprises a diode region 108 and an IGBT region 106. It should be noted that for clarification of an arrangement of constituent elements, FIG. 2 omits to illustrate a collector/cathode electrode 146 and an emitter/anode electrode 148.

In the diode region 108 of the semiconductor substrate 104, an n$^+$ cathode region 120, which is a high concentration n-type semiconductor region, an n buffer region 112, which is an n-type semiconductor region, a first n$^-$ drift region 114, which is a low concentration n-type semiconductor region, a lower anode region 168, which is a p-type semiconductor region, an n barrier region 122, which is an n-type semiconductor region, and an upper anode region 124, which is a p-type semiconductor region, are stacked on each other in this order. In the present embodiment, impurities such as phosphorus have been doped into the n-type semiconductor regions, and impurities such as boron have been doped into the p-type semiconductor regions. In the present embodiment, the n$^+$ cathode region 120 has an impurity concentration of approximately $1 \times 10^{17}$ to $5 \times 10^{20}$ [cm$^{-3}$]. The n buffer region 112 has an impurity concentration of approximately $1 \times 10^{16}$ to $1 \times 10^{19}$ [cm$^{-3}$]. The first n$^-$ drift region 114 has an impurity concentration of approximately $1 \times 10^{12}$ to $1 \times 10^{15}$ [cm$^{-3}$]. The lower anode region 168 has an impurity concentration of approximately $1 \times 10^{15}$ to $1 \times 10^{19}$ [cm$^{-3}$]. The n barrier region 122 has an impurity concentration of approximately $1 \times 10^{15}$ to $1 \times 10^{18}$ [cm$^{-3}$]. The upper anode region 124 has an impurity concentration of approximately $1 \times 10^{16}$ to $1 \times 10^{19}$ [cm$^{-3}$]. Further, the n barrier region 122 has a thickness of approximately 0.5 to 3.0 [μm], and the lower body region 166 has a thickness of approximately 0.5 to 3.0 [μm].

In the IGBT region 106 of the semiconductor substrate 104, a p$^+$ collector region 110, which is a high concentration p-type semiconductor region, the n buffer region 112, which is the n-type semiconductor region, a second n$^-$ drift region 115, which is in continuation from the first n$^-$ drift region 114 and is a low concentration n-type semiconductor region, a lower body region 166, which is a p-type semiconductor region, an n barrier region 116, which is an n-type semiconductor region, and an upper body region 118, which is a p-type semiconductor region, are stacked on each other in this order. In the present embodiment, impurities such as phosphorus have been doped into the n-type semiconductor regions, and impurities such as boron have been doped into the p-type semiconductor regions. In the present embodiment, the p$^+$ collector region 110 has an impurity concentration of approximately $1 \times 10^{17}$ to $5 \times 10^{20}$ [cm$^{-3}$]. The n buffer region 112 has an impurity concentration of approximately $1\times10^{16}$ to $1\times10^{19}$ [cm$^{-3}$]. The second n$^-$ drift region 115 has an impurity concentration of approximately $1\times10^{12}$ to $1\times10^{15}$ [cm$^{-3}$]. The lower body region 166 has an impurity concentration of approximately $1\times10^{15}$ to $1\times10^{19}$ [cm$^{-3}$]. The n barrier region 116 has an impurity concentration of approximately $1\times10^{15}$ to $1\times10^{18}$ [cm$^{-3}$]. The upper body region 118 has an impurity concentration of approximately $1\times10^{16}$ to $1\times10^{19}$ [cm$^{-3}$]. Further, the n barrier region 116 has a thickness of approximately 0.5 to 3.0 [μm], and the lower anode region 168 has a thickness of approximately 0.5 to 3.0 [μm].

Further, in an upper side of the semiconductor substrate 104, a plurality of trenches 126 is arranged at predetermined intervals.

In the diode region 108, each trench 126 extends from an upper surface of the upper anode region 124 through the n barrier region 122 and the lower anode region 168 into the first n$^-$ drift region 114. The trench 126 has its inner part filled with a gate electrode 140 covered with an insulation film 138. In the upper surface of the upper anode region 124, a plurality of n pillar regions 142, which are n-type semiconductor regions, is arranged at predetermined intervals from each other. Each of the n pillar regions 142 has an impurity concentration of approximately $1\times10^{16}$ to $1\times10^{19}$ [cm$^{-3}$]. The n pillar region 142 is formed so as to extend to an upper surface of the n-barrier region 122 through the upper anode region 124. Further, in the upper surface of the upper anode region 124, a plurality of p$^+$ contact regions 144, which are high concentration p-type semiconductor regions, is arranged at predetermined intervals from each other. Each of the p$^+$ contact regions 144 has an impurity concentration of approximately $1\times10^{17}$ to $1\times10^{20}$ [cm$^{-3}$].

In the IGBT region 106, each trench 126 extends from an upper surface of the upper body region 118 through the n barrier region 116 and the lower body region 166 into the second n$^-$ drift region 115. The trench 126 has its inner part filled with a gate electrode 130 covered with an insulation film 128. N$^+$ emitter regions 132 each is a high concentration n-type semiconductor region and is provided in a place on the upper surface of the upper body region 118 that is adjacent to the corresponding trench 126. The n$^+$ emitter region 132 has an impurity concentration of approximately $1\times10^{17}$ to $5\times10^{20}$ [cm$^{-3}$]. Further, an insulation film 129 is disposed on top of the gate electrode 130. The gate electrode 130 is opposed to the upper body region 118 and the lower body region 166 that are between the n$^+$ emitter region 132 and the second n$^-$ drift region 115, with the insulation film 128 interposed therebetween. Further, in the upper surface of the upper body region 118, a plurality of n pillar regions 134, which are n-type semiconductor regions, is arranged at predetermined intervals from each other. Each of the n pillar regions 134 has an impurity concentration of approximately $1\times10^{16}$ to $1\times10^{19}$ [cm$^{-3}$]. The n pillar region 134 is arranged so as to extend to an upper surface of the n-barrier region 116 through the upper body region 118. Furthermore, in the upper surface of the upper body region 118, a plurality of p$^+$ contact regions 136, which is high concentration p-type semiconductor regions, is provided at predetermined intervals from each other. Each of the p$^+$ contact regions 136 has an impurity concentration of approximately $1\times10^{17}$ to $1\times10^{20}$ [cm$^{-3}$].

On a lower surface of the semiconductor substrate 104, a collector/cathode electrode 146 configured of metal is provided. The collector/cathode electrode 146 is joined to the p$^+$ collector region 110 and the n$^+$ cathode region 120 by ohmic junction. The collector/cathode electrode 146 functions as a collector electrode in the IGBT region 106 and functions as a cathode electrode in the diode region 108.

On an upper surface of the semiconductor substrate 104, an emitter/anode electrode 148 configured of metal is provided. The emitter/anode electrode 148 forms a Schottky junction with each of the n pillar regions 134 via a Schottky interface 150 and forms a Schottky junction with each of the n pillar regions 142 via a Schottky interface 152. The Schottky junction between the emitter/anode electrode 148 and each of the pillar regions 134 and 142 can be formed by adjusting the impurity concentrations of the n pillar regions 134 and 142. In the present embodiment, the Schottky interfaces 150 and the Schottky interfaces 152 both have a barrier height of approximately 0.2 to 1.0 [eV]. Further, the emitter/anode electrode 148 is joined to the n$^+$ emitter regions 132 and p$^+$ contact regions 136 of the IGBT region 106 and the p$^+$ contact regions 144 of the diode region 108 by ohmic junctions. The emitter/anode electrode 148 functions as an emitter electrode in the IGBT region 106 and functions as an anode electrode in the diode region 108.

Further, an area of a junction surface between each n pillar region 134 and the emitter/anode electrode 148 in the IGBT region 106 may be larger than an area of a junction surface between each n pillar region 142 and the emitter/anode electrode 148 in the diode region 108. That is, the n pillar region 134 of the IGBT region 106 is larger in a Schottky junction area than the n pillar region 142 of the diode region 108. Due to this, a resistance value of the n pillar regions 134 between the emitter/anode electrode 148 and the n barrier region 116 is lower than a resistance value of the n pillar regions 142 between the emitter/anode electrode 148 and the n barrier region 122 when the semiconductor device 102 operates as a diode.

The gate electrodes 130 of the IGBT region 106 are electrically conducted to a first gate electrode terminal (not illustrated). The gate electrodes 140 of the diode region 108 are electrically conducted to a second gate electrode terminal (not illustrated).

As described above, the semiconductor device 102 has a structure in which the IGBT region 106, which functions as a trench-type IGBT, and the diode region 108, which functions as a free-wheeling diode, are connected in anti-parallel to each other.

The following will describe how the semiconductor device 102 operates. When a potential that is applied to the emitter/anode electrode 148 is higher by a predetermined potential than a potential that is applied to the collector/cathode electrode 146, the semiconductor device 102 is turned on as a diode. That is, when the diode region 108 is turned on, a parasitic diode, formed by the body regions 118 and 166 of the IGBT region 106, the drift regions 114 and 115, the n buffer region 112, and the cathode region 120, is turned on. As a result, a current flows from the emitter/anode electrode 148 to the collector/cathode electrode 146.

When the semiconductor device 102 is turned on as a diode, application of an on-voltage to the gate electrodes 130 of the IGBT region 106 causes an inversion layer to be formed around the gate electrodes 130. This causes the n$^+$ emitter regions 132, the n barrier region 116, and the second n$^-$ drift region 115 to be short-circuited in the IGBT region 106, thus suppressing injection of holes from the p$^+$ contact regions 136 and the upper body region 118 into the second n$^-$ drift region 115. Since the injection of holes from the body regions 118 and 166 of the IGBT region 106 into the drift regions 114 and 115 is suppressed, an effect of the parasitic diode on characteristics of the semiconductor device 102 (i.e. on a forward voltage of the diode region 108) is also diminished.

On the other hand, in a case where no on-voltage is applied to the gate electrodes 130, no inversion layer is formed around the gate electrodes 130, and the n⁺ emitter regions 132 and the second n⁻ drift region 115 will not be short-circuited. However, in the IGBT region 106, the Schottky junction between the emitter/anode electrode 148 and the n-pillar regions 134 is turned on, with a result that the emitter/anode electrode 148 and the n-pillar regions 134 are short-circuited. Similarly, in the diode region 108, too, the Schottky junction between the emitter/anode electrode 148 and the n-pillar regions 142 is turned on, with the result that the emitter/anode electrode 148 and the n-pillar regions 142 are short-circuited.

In the diode region 108, the n pillar regions 142 and the n barrier region 122 are at a substantially equal potential; therefore, a potential difference between the n barrier region 122 and the emitter/anode electrode 148 is substantially equal to a voltage drop at the Schottky interfaces 152. Since the voltage drop at the Schottky interfaces 152 is sufficiently smaller than a built-in voltage of a p-n junction between the upper anode region 124 and the n barrier region 122, the injection of holes from the p⁺ contact regions 144 and the upper anode region 124 into the first n⁻ drift region 114 is suppressed. Meanwhile, in the IGBT region 106, too, the n pillar regions 134 and the n barrier region 116 are at a substantially equal potential; therefore, a potential difference between the n barrier region 116 and the emitter/anode electrode 148 is substantially equal to a voltage drop at the Schottky interfaces 150. Since the voltage drop at the Schottky interfaces 150 is sufficiently smaller than a built-in voltage of a p-n junction between the upper body region 118 and the n barrier region 116, the injection of holes from the p⁺ contact regions 136 and the upper body region 118 into the second n⁻ drift region 115 is suppressed.

It should be noted here that the semiconductor device 102 according to Embodiment 1 is configured such that an area of each Schottky interface 152 in the diode region 108 is smaller than an area of each Schottky interface 150 in the IGBT region 106. That is, the resistance value of the n pillar regions 134 between the emitter/anode electrode 148 and the n barrier region 116 is lower than the resistance value of the n pillar regions 142 between the emitter/anode electrode 148 and the n barrier region 122 when the semiconductor device 102 operates as a diode. As a result, in the IGBT region 106 as compared with the diode region 108, the injection of holes from the p⁺ contact regions 136 and the upper body region 118 into the second n⁻ drift region 115 is further suppressed. This diminishes the effect of the parasitic diode on a diode current, thus making it possible to suppress a fluctuation in voltage in the diode region 108 that is caused by turning on/off the gate electrodes 130 of the IGBT region 106.

Further, since the resistance values can be adjusted by adjusting the areas of the Schottky junctions, there is no need to add an additional manufacturing step for adjusting the resistance values, and processing cost will not be increased. Further, since it is only necessary to adjust an area of a mask at the time of manufacturing, there will be no increase in a number of manufacturing steps.

The foregoing has described one embodiment. However, a specific aspect is not limited to the embodiment. The following will describe other embodiments. It should be noted that components in the other embodiments that are the same as those of Embodiment 1 described above will be given the same reference signs, and as such, will not be described below.

Embodiment 2

In a semiconductor device 102 according to Embodiment 2, an impurity concentration of each of n pillar regions 134 in the IGBT region 106 is higher than an impurity concentration of each of n pillar regions 142 in the diode region 108. For example, in Embodiment 2, the impurity concentration of the n pillar region 134 in the IGBT region 106 is approximately $1 \times 10^{16}$ to $1 \times 10^{19}$ [cm$^{-3}$], and the impurity concentration of the n pillar region 142 in the diode region 108 is approximately $1 \times 10^{16}$ to $1 \times 10^{19}$ [cm$^{-3}$]. The impurity concentration of the n pillar region 134 of the IGBT region 106 is set to be higher than the impurity concentration of the n pillar region 142 of the diode region 108. Differences in impurity concentration can be compared by an average concentration in each of the n pillar regions 134 and 142.

In Embodiment 2, due to the difference in impurity concentration between the n pillar regions 134 and 142, a resistance value of the n pillar region 134 between the emitter/anode electrode 148 and the n barrier region 116 is lower than a resistance value of the n pillar region 142 between the emitter/anode electrode 148 and the n barrier region 122 when the semiconductor device 102 operates as a diode. This makes it possible to suppress a fluctuation in voltage in the diode region 108 that is caused by turning on/off the gate electrodes 130 of the IGBT region 106. Further, since the resistance values can be adjusted by adjusting the impurity concentrations without changing a size of a semiconductor device, there will be no increase in size of a semiconductor device.

Embodiment 3

In a semiconductor device 102 according to Embodiment 3, a cross-sectional area of each of n pillar regions 134 in the IGBT region 106 is larger than a cross-sectional area of each of n pillar regions 142 in the diode region 108. The cross-sectional areas are measured in an x-z cross-section in FIG. 1.

In Embodiment 3, due to the difference in cross-sectional area between the n pillar regions 134 and 142, a resistance value of the n pillar region 134 between the emitter/anode electrode 148 and the n barrier region 116 is lower than a resistance value of the n pillar region 142 between the emitter/anode electrode 148 and the n barrier region 122 when the semiconductor device 102 operates as a diode. This makes it possible to suppress a fluctuation in voltage in the diode region 108 that is caused by turning on/off the gate electrodes 130 of the IGBT region 106.

Embodiment 4

In a semiconductor device 102 according to Embodiment 4, an impurity concentration of a n barrier region 116 in the IGBT region 106 is higher than an impurity concentration of an n barrier region 122 in the diode region 108. For example, in Embodiment 4, the impurity concentration of the n barrier region 116 in the IGBT region 106 is approximately $1 \times 10^{15}$ to $1 \times 10^{18}$ [cm$^{-3}$], and the impurity concentration of the n barrier region 122 in the diode region 108 is approximately $1 \times 10^{15}$ to $1 \times 10^{18}$ [cm$^{-3}$]. The impurity concentration of the n barrier region 116 of the IGBT region 106 is set to be higher than the impurity concentration of the n barrier region 122 of the diode region 108. Differences in impurity concentration can be compared by an average concentration in each of the n barrier regions 116 and 122.

In Embodiment 4, due to the difference in impurity concentration between the n barrier regions 116 and 122, a resistance value between the emitter/anode electrode 148 and the n barrier region 116 is lower than a resistance value between the emitter/anode electrode 148 and the n barrier region 122 when the semiconductor device 102 operates as a diode. This makes it possible to suppress a fluctuation in voltage in the diode region 108 that is caused by turning on/off the gate electrode 130 of the IGBT region 106.

Embodiment 5

Figure 3:
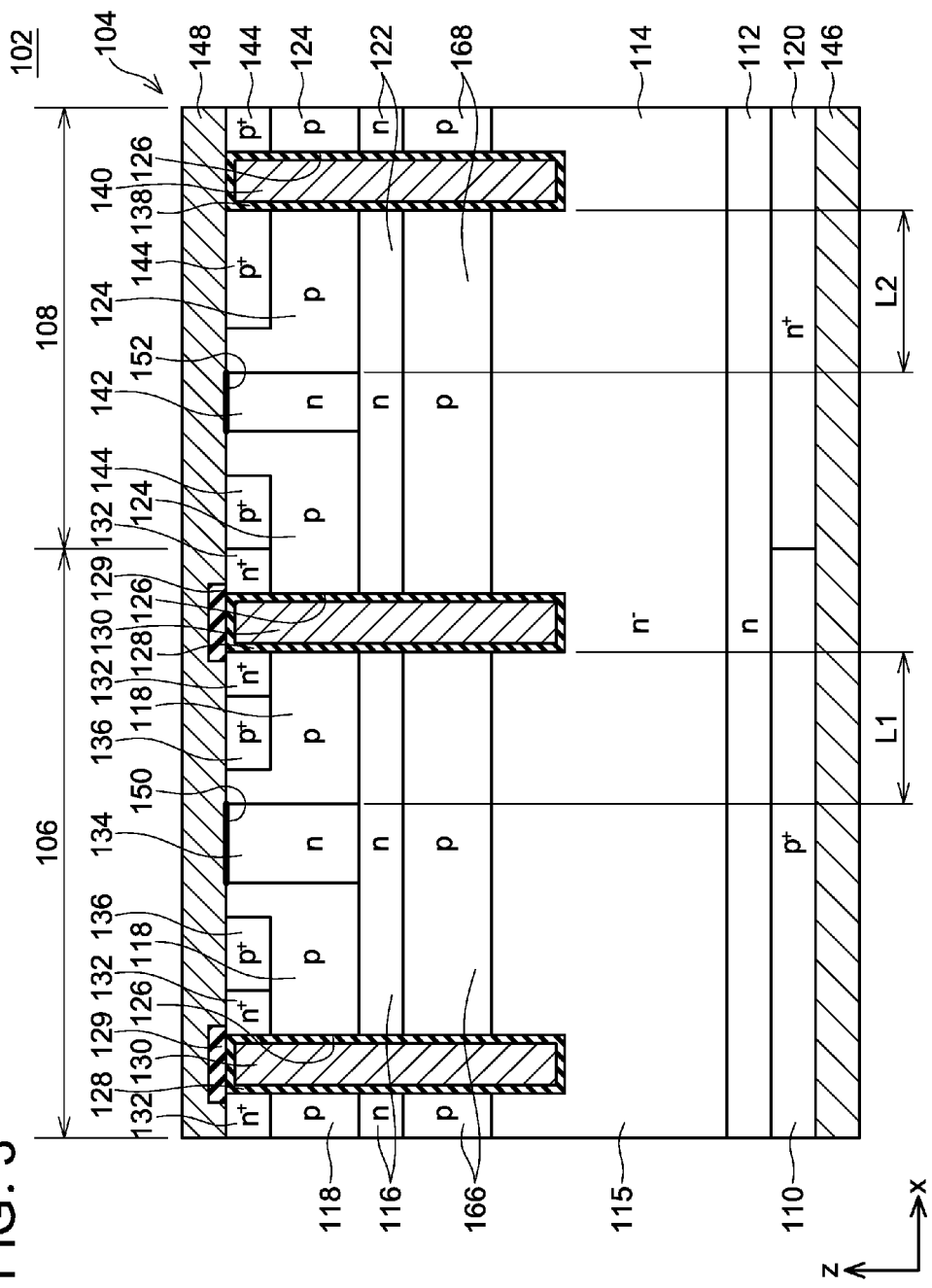
FIG. 3 is a cross-sectional view schematically showing a configuration of a semiconductor device.

In a semiconductor device 102 according to Embodiment 5, a length of an n barrier region 116 extending in a transverse direction from an edge of each of n-pillar regions 134 in the IGBT region 106 is greater than a length of an n barrier region 122 extending in a transverse direction from an edge of each of n pillar regions 142 in the diode region 108. The length of the n barrier region 116 in the IGBT region 106 corresponds to a distance L1 which is a distance between the edge of the n pillar region 134 and an edge of a corresponding trench 126 in an x direction of FIG. 3. Further, the length of the n barrier region 122 in the diode region 108 corresponds to a distance L2 which is a distance between the edge of the n pillar region 142 and an edge of a corresponding trench 126 in the x direction of FIG. 3.

In Embodiment 5, due to the difference in length between the n barrier regions 116 and 122, a resistance value between the emitter/anode electrode 148 and the n barrier region 116 is lower than a resistance value between the emitter/anode electrode 148 and the n barrier region 122 when the semiconductor device 102 operates as a diode. This makes it possible to suppress a fluctuation in voltage in the diode region 108 that is caused by turning on/off the gate electrode 130 of the IGBT region 106.

Embodiment 6

Figure 4:
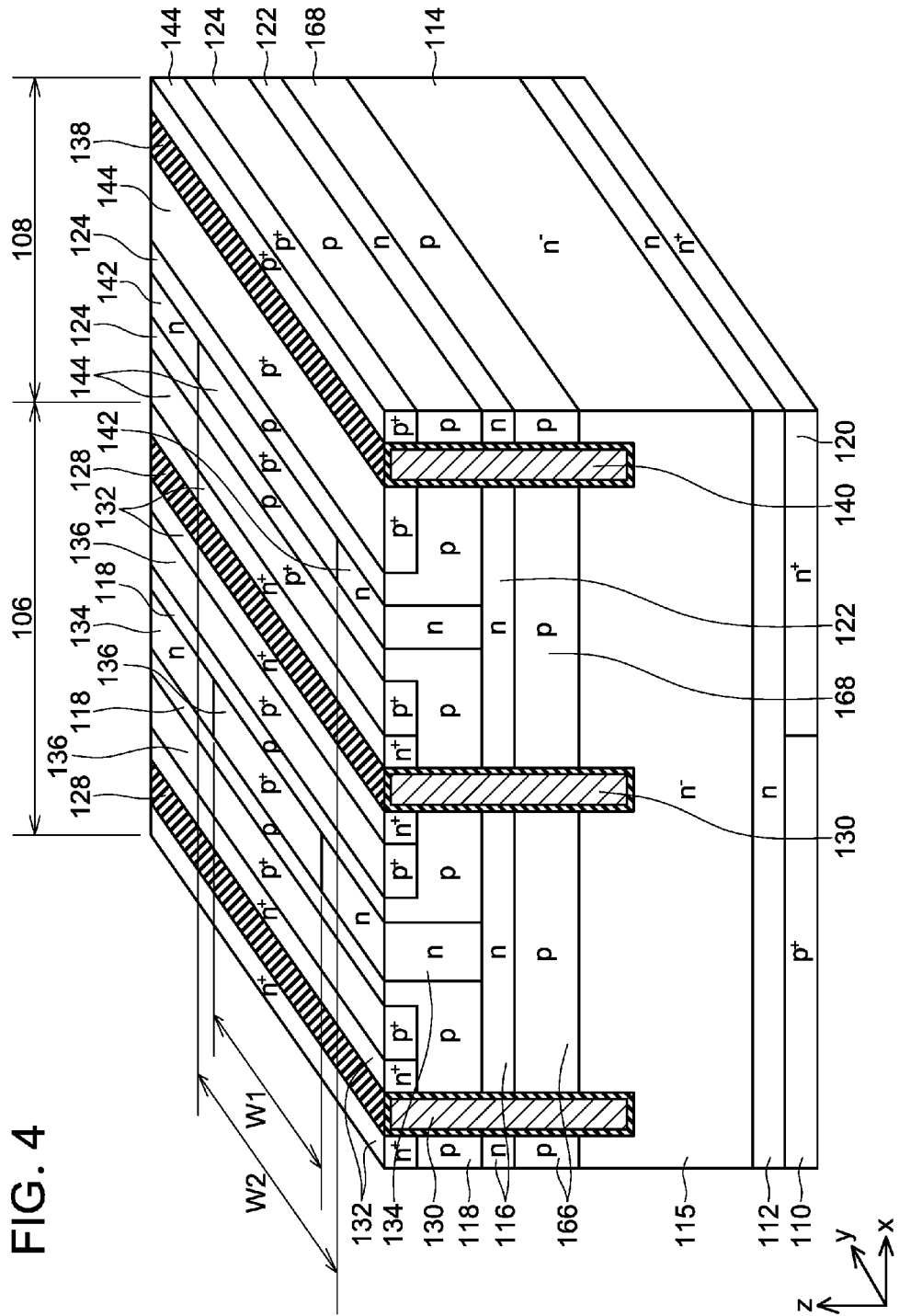
FIG. 4 is a perspective view schematically showing a configuration of a semiconductor device.

In a semiconductor device 102 according to Embodiment 6, an interval between adjacent n pillar regions 134 in the IGBT region 106 is narrower than an interval between adjacent n pillar regions 142 in the diode region 108. The interval between adjacent n pillar regions 134 in the IGBT region 106 corresponds to a distance W1 between edges of n pillar regions 134 adjacent to each other in a y direction of FIG. 4 (i.e. a longitudinal direction of the trenches 126). Further, the interval between adjacent n pillar regions 142 in the diode region 108 corresponds to a distance W2 between edges of n pillar regions 142 adjacent to each other in the y direction of FIG. 4 (i.e. a longitudinal direction of the trenches 126).

In Embodiment 6, due to the difference in interval between the n pillar regions 134 and 142, a resistance value of the n pillar regions 134 between the emitter/anode electrode 148 and the n barrier region 116 is lower than the resistance value of the n pillar regions 142 between the emitter/anode electrode 148 and the n barrier region 122 when the semiconductor device 102 operates as a diode. This makes it possible to suppress a fluctuation in voltage in the diode region 108 that is caused by turning on/off the gate electrode 130 of the IGBT region 106.

Embodiment 7

In a semiconductor device 102 according to Embodiment 7, an impurity concentration of an upper body region 118 in the IGBT region 106 is lower than an impurity concentration of an upper anode region 124 in the diode region 108. For example, in Embodiment 7, the impurity concentration of the upper body region 118 in the IGBT region 106 is approximately $1 \times 10^{16}$ to $1 \times 10^{19}$ [cm$^{-3}$], and the impurity concentration of the upper anode region 124 in the diode region 108 is approximately $1 \times 10^{16}$ to $1 \times 10^{19}$ [cm$^{-3}$]. The impurity concentration of the upper body region 118 of the IGBT region 106 is set to be lower than the impurity concentration of the upper anode region 124 of the diode region 108. Differences in the impurity concentration can be compared by average concentrations in the upper body region 118 and the upper anode region 124. In Embodiment 7, due to the difference in the impurity concentration between the upper body region 118 and the upper anode region 124, a quantity of holes between the emitter/anode electrode 148 and the second barrier region 116 in the IGBT region 106 is smaller than a quantity of holes between the emitter/anode electrode 148 and the barrier region 122 in the diode region 108 when no voltage is applied between the collector/cathode electrode 146 and the emitter/anode electrode 148 (i.e. between the cathode electrode and the anode electrode and between the collector electrode and the emitter electrode). Therefore, in the IGBT region 106 as compared with the diode region 108, the injection of holes from the upper body region 118 into the second n$^-$ drift region 115 is further suppressed. This diminishes the effect of the parasitic diode on a diode current, thus making it possible to suppress a fluctuation in voltage in the diode region 108 that is caused by turning on/off the gate electrodes 130 of the IGBT region 106.

Embodiment 8

In a semiconductor device 102 according to Embodiment 8, an impurity concentration of each of p$^+$ contact regions 136 in the IGBT region 106 is lower than an impurity concentration of each of p$^+$ contact regions 144 in the diode region 108. For example, in Embodiment 7, the impurity concentration of the p$^+$ contact region 136 in the IGBT region 106 is approximately $1 \times 10^{17}$ to $1 \times 10^{20}$ [cm$^{-3}$], and the impurity concentration of the p$^+$ contact region 144 in the diode region 108 is approximately $1 \times 10^{17}$ to $1 \times 10^{20}$ [cm$^{-3}$]. The impurity concentration of the p$^+$ contact region 136 of the IGBT region 106 is set to be lower than the impurity concentration of the p$^+$ contact region 144 of the diode region 108. Differences in impurity concentration can be compared by an average concentration in each of the p$^+$ contact regions 136 and 144. In Embodiment 8, due to the difference in impurity concentration between the p$^+$ contact regions 136 and 144, a quantity of holes between the emitter/anode electrode 148 and the second barrier region 116 in the IGBT region 106 is smaller than a quantity of holes between the emitter/anode electrode 148 and the barrier region 122 in the diode region 108 when no voltage is applied between the collector/cathode electrode 146 and the emitter/anode electrode 148 (i.e. between the cathode electrode and the anode electrode, and between the collector electrode and the emitter electrode). Therefore, in the IGBT region 106 as compared with the diode region 108, the injection of holes from the p$^+$ contact regions 136 into the second n$^-$ drift region 115 is further suppressed. This diminishes the effect of the parasitic diode on a diode current, thus making it possible to suppress a fluctuation in voltage in the diode region 108 that is caused by turning on/off the gate electrodes 130 of the IGBT region 106.

Embodiment 9

In a semiconductor device 102 according to Embodiment 9, a cross-sectional area of each of p$^+$ contact regions 136 in the IGBT region 106 is smaller than a cross-sectional area of each of p$^+$ contact regions 144 in the diode region 108. The cross-sectional areas are measured in the x-z cross-section of in FIG. 1. In Embodiment 9, due to the difference in cross-sectional area between the p$^+$ contact regions 136 and 144, a quantity of holes between the emitter/anode electrode 148 and the second barrier region 116 in the IGBT region 106 is smaller than a quantity of holes between the emitter/anode electrode 148 and the barrier region 122 in the diode region 108 when no voltage is applied between the collector/cathode electrode 146 and the emitter/anode electrode 148 (i.e. between the cathode electrode and the anode electrode and between the collector electrode and the emitter electrode). Therefore, in the IGBT region 106 as compared with the diode region 108, the injection of holes from the p$^+$ contact regions 136 into the second n$^-$ drift region 115 is further suppressed. This diminishes the effect of the parasitic diode on a diode current, thus making it possible to suppress a fluctuation in voltage in the diode region 108 that is caused by turning on/off the gate electrode 130 of the IGBT region 106.

While specific examples of the present invention have been described above in detail, these specific examples are merely illustrative and place no limitation on the scope of the patent claims. The technology described in the patent claims also encompasses various changes and modifications to the specific examples described above. The technical elements explained in the present description or drawings provide technical utility either independently or through various combinations. The present invention is not limited to the combinations described at the time the claims are filed. Further, the purpose of the examples illustrated by the present description or drawings is to satisfy multiple objectives simultaneously, and satisfying any one of those objectives gives technical utility to the present invention.

REFERENCE SIGNS LIST

102; semiconductor device; 104 semiconductor substrate; 106 IGBT region; 108 diode region; 110 p$^+$ collector region; 112 n buffer region; 114 first n$^-$ drift region; 115 second n$^-$ drift region; 116 n barrier region; 118 upper body region; 120 n$^+$ cathode region; 122 n barrier region; 124 upper anode region; 126 trench; 128 insulation film; 129 insulation film; 130 gate electrode; 132 n$^+$ emitter region; 134 n pillar region, 134a pillar electrode; 136 p$^+$ contact region; 138 insulation film; 140 gate electrode; 142 n pillar region; 142a pillar electrode; 144 p$^+$ contact region; 146 collector/cathode electrode; 148 emitter/anode electrode; 150 Schottky interface; 152 Schottky interface; 166 lower body region; 168 lower anode region

The invention claimed is:

1. A semiconductor device comprising a diode region and an IGBT region in a same semiconductor substrate,
wherein
the diode region comprises: a cathode electrode; a cathode region configured of a first conductive type semiconductor; a first drift region configured of a first conductive type semiconductor having a low impurity concentration; a lower anode region configured of a second conductive type semiconductor; an upper anode region configured of a second conductive type semiconductor; an anode electrode configured of metal; a first barrier region configured of a first conductive type semiconductor having a higher impurity concentration than the impurity concentration of the first drift region, and arranged between the lower anode region and the upper anode region; and a first pillar region configured of a first conductive type semiconductor having a higher impurity concentration than the impurity concentration of the first barrier region, and arranged so as to connect the first barrier region and the anode electrode,
the first pillar region and the anode electrode make a Schottky junction,
the IGBT region comprises: a collector electrode; a collector region configured of a second conductive type semiconductor; a second drift region configured of a first conductive type semiconductor having a low impurity concentration, and being in continuation with the first drift region; a lower body region configured of a second conductive type semiconductor; an upper body region configured of a second conductive type semiconductor; an emitter region configured of a first conductive type semiconductor; an emitter electrode configured of metal; a gate electrode opposed to the lower body region and the upper body region that are between the emitter region and the second drift region, with an insulation film interposed therebetween; a second barrier region configured of a first conductive type semiconductor having a higher impurity concentration than the impurity concentration of the second drift region, and arranged between the lower body region and the upper body region; and a second pillar region configured of a first conductive type semiconductor having a higher impurity concentration than the impurity concentration of the second barrier region,
the second pillar region and the emitter electrode make a Schottky junction, and
a resistance value of the second pillar region between the emitter electrode and the second barrier region is lower than a resistance value of the first pillar region between the anode electrode and the first barrier region when the semiconductor device operates as a diode.

2. The semiconductor device according to claim 1, wherein
an area of a junction surface between the second pillar region and the emitter electrode is larger than an area of a junction surface between the first pillar region and the anode electrode.

3. The semiconductor device according to claim 1, wherein
the impurity concentration of the second pillar region is higher than the impurity concentration of the first pillar region.

4. The semiconductor device according to claim 1, wherein
when no voltage is applied between the cathode electrode and the anode electrode and between the collector electrode and the emitter electrode, a quantity of holes between the emitter electrode and the second barrier region is smaller than a quantity of holes between the anode electrode and the first barrier region.

* * * * *